United States Patent
Raichle

(10) Patent No.: US 6,791,332 B2
(45) Date of Patent: Sep. 14, 2004

(54) ALTERNATOR TESTING DEVICE AND METHOD

(75) Inventor: Kurt Raichle, Owatonna, MN (US)

(73) Assignee: SPX Corporation, Charlotte, NC (US)

(*) Notice: Subject to any disclaimer, the term of this patent is extended or adjusted under 35 U.S.C. 154(b) by 0 days.

(21) Appl. No.: 10/314,971

(22) Filed: Dec. 10, 2002

(65) Prior Publication Data

US 2004/0108855 A1 Jun. 10, 2004

(51) Int. Cl.⁷ .......................................... G01N 27/416
(52) U.S. Cl. .................................................. 324/429
(58) Field of Search ................................ 324/426, 772, 324/429; 318/490

(56) References Cited

U.S. PATENT DOCUMENTS 5,550,485 A * 8/1996 Falk ........................... 324/772

* cited by examiner

Primary Examiner—N. Lo
Assistant Examiner—Amy He
(74) Attorney, Agent, or Firm—Baker & Hostetler LLP

(57) ABSTRACT

An alternator testing system is disclosed that includes a current source, a motor, and a drive belt. The drive belt couples the motor to an alternator, which operates outside of a motor vehicle, and the current source and the motor enable diodes of the alternator to output a current that is not limited by input power to the motor. Accordingly, defective diodes may be detected.

21 Claims, 1 Drawing Sheet

ALTERNATOR TESTING DEVICE AND METHOD

FIELD OF THE INVENTION

This invention relates generally to testing devices. More particularly, the present invention is directed to a device and method for testing alternators.

BACKGROUND OF THE INVENTION

Alternators are typically tested outside of the motor vehicles in which they are utilized to charge the batteries and supply power to other electrical loads in motor vehicles. Many testing devices and methods for utilize a motor to drive the alternator during testing. However, improvements can be made to alternator testing systems that produce a current output from the alternator.

The output current of the alternator during testing with these devices is limited to the amount of power available from the power source to which the motor is connected.

Typically, the motor receives its power from a one hundred twenty volt alternating current (AC) receptacle, which causes the alternator to output about five to ten amperes (amps) of AC current, rather than an approximate one hundred amps of AC current that the alternator would output if the alternator was operating at full capacity within a motor vehicle.

An alternator contains three coils, and each of the three coils generates an AC voltage. A pair of diodes are coupled to the AC voltage output of each coil. The diodes allow current to flow in one direction and prevent a battery from discharging by stopping the flow of current to ground. The diodes also convert the AC voltage to direct current (DC) voltage. Notwithstanding the use of the diodes, a slight amount of ripple voltage usually remains.

If the diodes are defective, the amount of ripple voltage that manifests at the terminal of the alternator, which would be connected to a battery of a motor vehicle, significantly increases. During testing, therefore the alternator will generate a low output current of the order of five to fifteen amps, which is still well below the alternator's full capacity current output. Thus, the amount of ripple voltage, when occurring, will also be relatively small. Accordingly, the ability to detect malfunctioning alternator diodes may be difficult.

Thus, it would also be desirable to provide a device and method for testing an alternator that allows an alternator under test to output an amount of current at or near its full current output capacity. It would also be desirable to provide a device and method for detecting malfunctioning alternator diodes.

SUMMARY OF THE INVENTION

In one aspect of the invention an alternator testing system is provided that includes a current source, a motor and a drive belt. The drive belt couples the motor to an alternator that operates outside of a motor vehicle, and the current source and the motor enable diodes of the alternator to output a current that is not limited by input power to the motor.

In another aspect of the invention, an alternator testing system is provided in which the current source is a switching power supply.

In another aspect of the invention, an alternator testing system is provided in which the current source is a transformer.

In another aspect of the invention, an alternator testing system is provided in which the current source outputs approximately eighty amps of current.

In another aspect of the invention, an alternator testing system is provided in which the input power to the motor is a 120 volt, AC power source.

In another aspect of the invention, an alternator testing system is provided in which the motor causes the alternator to output between approximately five to fifteen amps.

In another aspect of the invention, an alternator testing system is provided in which the motor and the current source cause the alternator to output between 85 to 100 amps.

In another aspect of the invention, an alternator testing system is provided in which a resistor is positioned between a first output terminal of the alternator and the current source.

In another aspect of the invention, an alternator testing system is provided in which the resistor is utilized to establish an excitation voltage for the alternator.

In another aspect of the invention, an alternator testing system is provided in which the output current through the resistor is measured.

In another aspect of the invention, an alternator testing system is provided in which a resistor is positioned between the first output terminal of the alternator and ground.

In another aspect of the invention, an alternator testing system is provided in which a current sensor, which generates an output voltage is positioned in series with the resistor.

In another aspect of the invention, an alternator testing system is provided in which an analog-to-digital (A/D) converter converts the voltage output from the current sensor to a digital signal.

In another aspect of the invention, an alternator testing system is provided in which an output voltage from the alternator is fed into the A/D converter.

In another aspect of the invention, an alternator testing system is provided in which a testing device is provided that has software which analyzes the digital signal and identifies irregularities in performance by the diodes.

In yet another aspect of the present invention, a method for testing an alternator is provided that includes, supplying a first current to an alternator that operates independently from a motor vehicle, utilizing an independent current source, and generating a second current from the alternator utilizing a motor, wherein the first current and the second current enable diodes of the alternator to output a current that is not limited by input power to the motor.

Further, in another aspect of the present invention, an alternator testing system is provided that includes, a means for supplying a current to an alternator, a means for driving an alternator, and a means for coupling the driving means to the alternator. The current supplying means and the driving means enable diodes of the alternator to output a current that is not limited by input power to the motor.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

DETAILED DESCRIPTION OF PREFERRED EMBODIMENTS OF THE INVENTION

Figure 1:
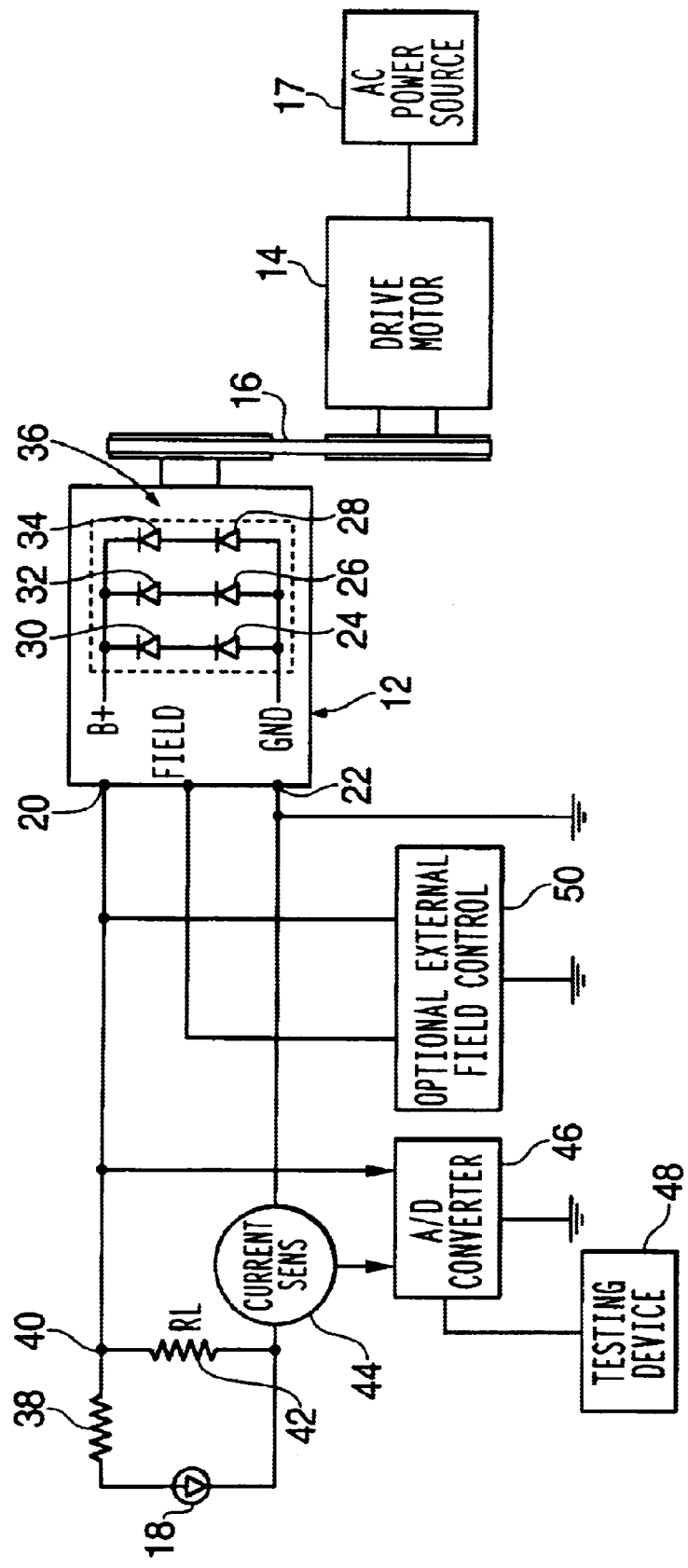
FIG. 1 illustrates an alternator testing system in accordance with the present invention.

Referring now to FIG. 1, shown is a novel alternator testing system 10, constructed in accordance with the present invention, for testing an alternator 12 independent of a motor vehicle system for which it is designed to serve. The testing system 10 is particularly designed to allow an alternator 12 under test to output an amount of current that is not dependent upon the input power to a driving device 14. Accordingly, an alternator being tested 12, in accordance with the present invention outputs a current closer to, or approximately equal to, the amount of current the alternator 12 would output if the alternator 12 was operating within a motor vehicle system.

In a preferred embodiment of the present invention, the driving device 14 is a motor. A drive belt 16 couples the driving device 14 to alternator 12 under test. The driving device is coupled to an AC power source 17. In a preferred embodiment of the present invention, the power source 17 is a 120 volt AC power supply that generates about five to fifteen amps of current output from the alternator 12.

A current source 18 is connected between a first output terminal 20 of the alternator 12, and a second output terminal 22 of the alternator 12. In a preferred embodiment of the present invention, the current source 18 is an independent current source, such as a transformer or a switching power supply. The current source 18 is utilized to pre-bias the alternator, i.e., to force a current through diodes 24–34 of circuitry 36 the alternator 12. In the preferred embodiment of the present invention, the voltage produced by the alternator 12 is output to the first output terminal 20 of the alternator 12, and the second output terminal 22 is connected to ground.

In the preferred embodiment of the present invention, the motor 14 and the current source 18 of the alternator testing system of the present invention cause the alternator 12 under test to output current amounts at or near the alternator's full output capacity, for example, about eighty-five to one hundred amps of current. Accordingly, an alternator testing system 10 in accordance with the present invention is able to produce an amount of current from the alternator 12 under test that is not solely dependent on the amount of input power from the driving device 14.

Alternators 12 are designed to maintain a constant amount of voltage at the first output terminal 20 that would be coupled to a battery if the alternator 12 was placed in a motor vehicle system. As the electrical loads of a motor vehicle utilize the voltage (charge) supplied to the first output terminal 20, the alternator 12, via its own electrical circuitry, will operate to maintain a pre-determined amount of voltage at the first output terminal 20, i.e., keep the battery charged.

In the preferred embodiment of the present invention, a first resistor 38 is positioned between the first output terminal 20 of the alternator 12 and the current source 18.

A second resistor 42, for example a varistor serves as a load and is positioned in parallel with the current source, and across the first and second output terminals 20, 22 of the alternator 12. However, an alternator 12 requires an initial amount of voltage to energize it before it can produce a voltage and/or current output via its own circuitry. When the current source 18 is energized, a voltage is established at a first node 40. The first resistor 38 is utilized to produce a pre-determined amount of voltage at the first output terminal 20 of the alternator 12, to activate the alternator 12 such that the alternator 12 begins to produce its own voltage output at the first output terminal 20.

The current drawn from the output voltage of the alternator 12 through the second resistor 42 can be measured. The resistance value of the second resistor 42 represents the resistance of an electrical load, such as a headlight of a motor vehicle system that would utilize the charge stored at the first output terminal 20 of the alternator 12. The resistance of the second resistor 42 may be selected to accommodate the power and current associated with the driving device 14 and the current source 18, respectively, that are coupled to the alternator 12.

In the preferred embodiment of the present invention, a current sensor 44 is connected in series with the current source 18 and the second resistor 42. The current sensor monitors the amount of current output from the current source 18 plus the current through the second resistor 42. The current sensor 44, in response to sensed current, outputs an AC voltage that corresponds to the amount of current that it senses.

An A/D converter 46 is coupled to the current sensor 44. The A/D converter converts the AC voltage output from the current sensor to a digital signal. A testing device 48, having evaluation software, receives the digital signal output from the A/D converter and analyzes the data to verify the current output from the current source 18, and to identify occurrences of ripple current through the second resistor 42. Accordingly, the testing device 48 is able to ascertain whether any of the alternator diodes 24–34 have failed.

In a preferred embodiment of the present invention, the output voltage at the first output terminal 20 of the alternator 12 is sampled by the A/D converter 46. Accordingly, occurrences of ripple voltage i.e., AC voltage that passes through the diodes is converted to a digital signal that is input to the testing device 48. Accordingly, the output voltage at the first output terminal can be analyzed for excessive ripple voltage resulting from ripple current that passes through the diodes 24–34, and malfunctioning diodes 24–34 may be detected.

A field control device 50 may be provided external or internal to the alternator 12 as a method of controlling the amount of voltage output by the alternator 12 to the first output terminal 20. In the preferred embodiment of the present invention, the field control device 50 is designed utilizing transistors, for example, field-effect transistors and other transistors.

In accordance with the foregoing, an alternator testing system 10 is provided that allows an alternator 12 to output an amount of current near or approximately equal to its full current output capacity, so that any malfunctioning diodes 24–34 may be detected. Accordingly, more reliable alternators 12 are produced.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An alternator testing system, comprising:
    a motor that drives an alternator undergoing testing, the motor comprises an initial current source for the alternator;
    a secondary current source that provides additional current to the alternator in order to simulate approximate full capacity capabilities;
    a drive belt, coupled to the alternator and the motor;
    a simulated load that is detachably placed on an output voltage of the alternator;
    a current sensor linked to the secondary current source and load, the current sensor monitors and reports current from the current source and the simulated load; and
    an evaluator that receives the reports from the current sensor and ascertains a presence of a ripple current.

2. The alternator testing system of claim 1, wherein the current source is a switching power supply.

3. The alternator testing system of claim 1, wherein the current source is a transformer.

4. The alternator testing system of claim 1, wherein the current source delivers approximately eighty amperes (amps) of current to the alternator.

5. The alternator testing system of claim 4, wherein the input power to the motor is a 120 volt alternating current (AC) power source.

6. The alternator system of claim 5, wherein the motor causes the alternator to output between approximately five to fifteen amps.

7. The alternator testing system of claim 6, wherein the motor and the current source cause the alternator to output between 85 to 100 amps.

8. The alternator testing system of claim 1, further comprising a resistor positioned between a first output terminal of the alternator and the current source.

9. The alternator testing system of claim 8, wherein the resistor is utilized to establish an excitation voltage for the alternator.

10. The alternator testing system of claim 1, further comprising a resistor, wherein the current through the resistor is measured.

11. The resistor of claim 10, wherein the resistor is positioned between the first output terminal of the alternator and ground.

12. The alternator testing system of claim 1, further comprising an analog-to-digital (A/D) converter that converts the output voltage to a first digital signal.

13. The alternator testing system of claim 12, wherein an output voltage from the alternator is fed into the A/D converter and a second digital signal is generated.

14. The alternator testing system of claim 13, a wherein the evaluator is coupled to the A/D converter, the evaluator has software that analyzes the second digital signal and identifies irregularities in performance by diodes in the alternator.

15. The alternator testing system of claim 12, wherein the evaluator has software that analyzes the current and identifies irregularities in performance by diodes in the alternator.

16. An alternator testing system, comprising:
    means for driving an alternator;
    means for supplying a current to an alternator that is independent from the means for driving such that the alternator is tested under approximate full capacity working capabilities;
    means for coupling the driving means to the alternator;
    means for simulating a load on an output voltage on the alternator;
    means for sensing a current reading on the means for supplying and the means for simulating, the means for sensing monitors and reports this current; and
    means for evaluating the presence of a ripple current from the current reading.

17. The alternator testing system of claim 16, wherein the driving means is a motor.

18. The alternator testing system of claim 16, wherein the current supplying means is an independent current source.

19. A method for testing an alternator, comprising:
    utilizing an independent current source to supply a first current to an alternator;
    generating a second current from the alternator utilizing a motor, wherein the first current and the second current enable diodes of the alternator to output a current that is not limited by input power to the motor;
    simulating a load on the alternator;
    sensing the first and second current with a current sensor; and
    evaluating the presence of a ripple current from the sensed first and second current.

20. The method for testing an alternator of claim 19, further comprising converting a voltage output from the current sensor to a digital signal.

21. The method for testing an alternator of claim 20, further comprising analyzing the digital signal for occurrences of ripple current.

* * * * *